(12) United States Patent  
Wu et al.

(10) Patent No.: US 12,550,734 B2
(45) Date of Patent: Feb. 10, 2026

(54) INTEGRATED CIRCUIT PACKAGE AND METHOD

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 612 days.

(21) Appl. No.: 17/711,241

(22) Filed: Apr. 1, 2022

(65) Prior Publication Data

US 2023/0245947 A1 Aug. 3, 2023

Related U.S. Application Data

(60) Provisional application No. 63/267,323, filed on Jan. 31, 2022.

(51) Int. Cl.
*H01L 23/433* (2006.01)
*H01L 21/48* (2006.01)
(Continued)

(52) U.S. Cl.
CPC ...... *H01L 23/4334* (2013.01); *H01L 21/4871* (2013.01); *H01L 24/08* (2013.01); *H01L 24/80* (2013.01); *H01L 25/0657* (2013.01); *H01L 2224/08147* (2013.01); *H01L 2224/80895* (2013.01); *H01L 2224/80896* (2013.01);
(Continued)

(58) Field of Classification Search
CPC . H01L 23/4334; H01L 21/4871; H01L 24/08; H01L 24/80; H01L 25/0657; H01L 2224/08147; H01L 2224/80895; H01L 2224/80896; H01L 2225/06524; H01L 2225/06541; H01L 2225/06568; H01L 2225/06589; H01L 23/66; H01L 25/18; H01L 2225/06527; H01L 23/3677; H01L 2225/06544; H01L 2225/06548; H01L 25/50; H01L 23/367; H01L 23/31; H01L 23/3736; H01L 21/4882; H01L 21/56; H01L 23/3171; H01L 23/3185;
(Continued)

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

KR 20150143309 A 12/2015

*Primary Examiner* — Christine S. Kim
*Assistant Examiner* — Sesha Sairaman Srinivasan
(74) *Attorney, Agent, or Firm* — Slater Matsil, LLP

(57) ABSTRACT

A device package includes a first die directly bonded to a second die at an interface, wherein the interface comprises a metal-to-metal bond and a heat dissipation feature over the first die. The heat dissipation feature includes a thermal base over the first die and surrounding the second die, wherein the thermal base is made of a metal; and a plurality of thermal vias on the thermal base; and an encapsulant over first die and surrounding the second die, surrounding the thermal base, and surrounding the plurality of thermal vias.

20 Claims, 17 Drawing Sheets

(51) Int. Cl.
  *H01L 23/00*    (2006.01)
  *H01L 23/367*   (2006.01)
  *H01L 23/66*    (2006.01)
  *H01L 25/065*   (2023.01)
  *H01L 25/18*    (2023.01)
(52) U.S. Cl.
  CPC ............... *H01L 2225/06524* (2013.01); *H01L 2225/06541* (2013.01); *H01L 2225/06568* (2013.01); *H01L 2225/06589* (2013.01)
(58) Field of Classification Search
  CPC ......... H01L 24/03; H01L 24/07; H01L 25/16; H01L 2224/08146
  See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2008/0246126 A1* | 10/2008 | Bowles | H01L 25/50 257/659 |
| 2009/0166873 A1 | 7/2009 | Yang et al. | |
| 2012/0049347 A1 | 3/2012 | Wang | |
| 2013/0001773 A1 | 1/2013 | Cho et al. | |
| 2014/0061937 A1* | 3/2014 | Hu | H01L 24/97 257/774 |
| 2017/0133351 A1* | 5/2017 | Su | H01L 23/5389 |
| 2017/0358556 A1* | 12/2017 | Bitz | H01L 23/42 |
| 2017/0373037 A1* | 12/2017 | Yu | H10N 70/826 |
| 2019/0238134 A1* | 8/2019 | Lee | H01L 23/49811 |
| 2020/0105635 A1* | 4/2020 | Yu | H01L 23/3677 |
| 2020/0279814 A1 | 9/2020 | Huang et al. | |
| 2020/0373485 A1 | 11/2020 | Yu et al. | |
| 2021/0098381 A1 | 4/2021 | Yu et al. | |
| 2021/0098421 A1* | 4/2021 | Wu | H01L 23/49811 |
| 2021/0249328 A1 | 8/2021 | Refai-Ahmed et al. | |

* cited by examiner

INTEGRATED CIRCUIT PACKAGE AND METHOD

PRIORITY

This application claims the benefit of U.S. Provisional Application No. 63/267,323, filed on Jan. 31, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
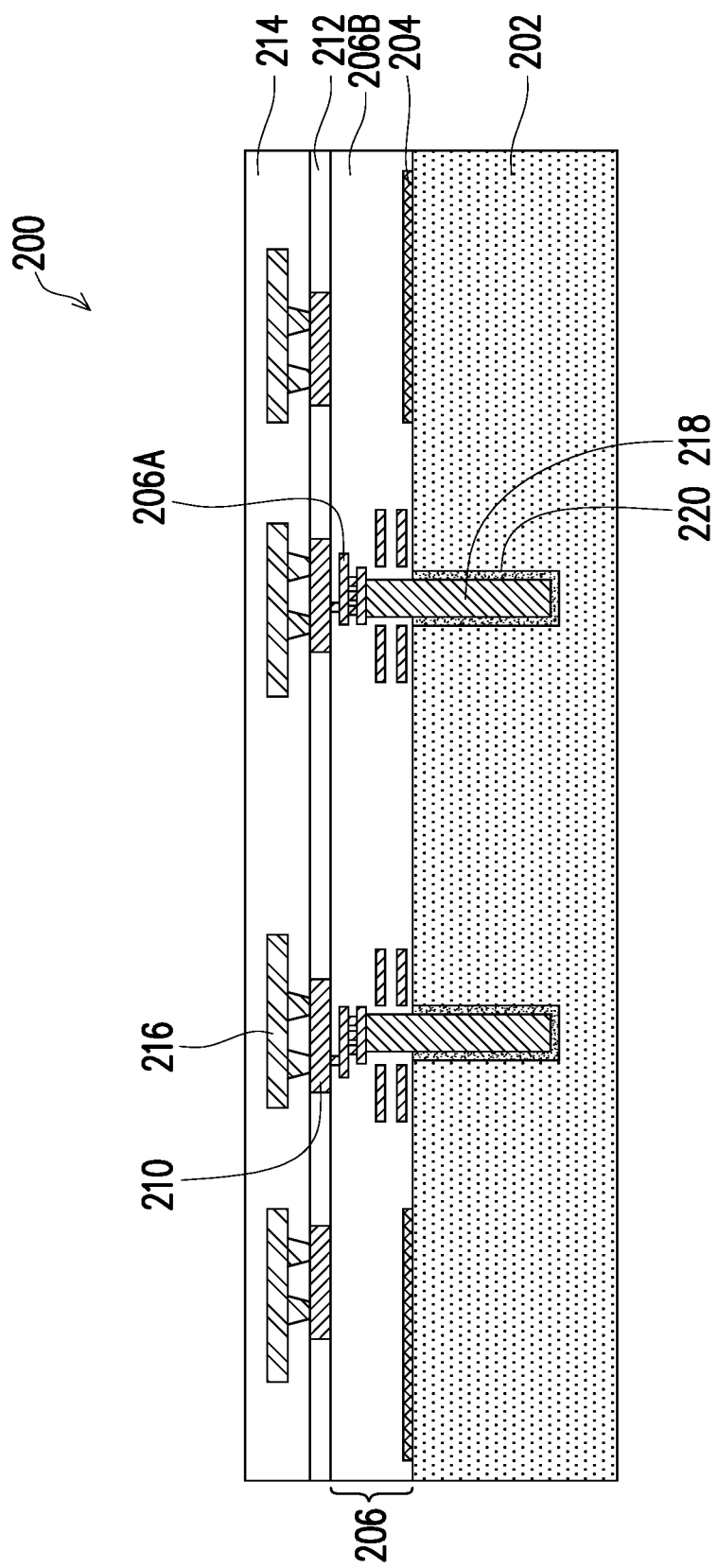
FIGS. 1A, 1B, 2, 3, 4, 5A, 5B, 6, 7, 8A, 8B, and 8C illustrate cross-sectional and top-down views of manufacturing a semiconductor package according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, semiconductor devices may be bonded together to provide a 3D integrated chip (3DIC) package, such as a system on integrated chip (SoIC) package. The bottom semiconductor device may extend laterally past edges of the top semiconductor device. In some embodiments, heat may be dissipated away from the bottom semiconductor device by metal heat dissipation structures that are on a surface of the bottom semiconductor device and adjacent to the top semiconductor device. The metal heat dissipation structures may be formed by a two separate lithography and electroplating processes which forms a thermal base and a plurality of thermal vias on the thermal base. The metal heat dissipation structures may be adapted to a particular configuration based on package device and/or thermal management requirements of the device. Advantages may be achieved by providing a heat dissipation structure according to various embodiments. The advantages include high thermal dissipation efficiency, targeted hot spot management by overlapping heat dissipation features with device hot spots, ease of integration with SoIC processes, excellent hot spot area targeting with the two lithography processes, ease of manufacturing and adaptation to different package configurations (e.g., different package component shapes and/or dimensions).

FIGS. 1A through 8C are cross-sectional views of intermediate steps of a process for forming a semiconductor package 400 (see FIGS. 8A-8C) in accordance with some embodiments. The semiconductor package 400 includes a heat dissipation comprising, for example, a plurality of thermal vias on a thermal base. The thermal base and the thermal vias may each be metallic, which provides relatively high thermal conductivity, such as a higher thermal conductivity than silicon. In this manner, thermal dissipation in the package 400 may be approved.

Referring to FIG. 1A, a semiconductor die 200 is illustrated. The semiconductor die 200 may be a bare chip semiconductor die (e.g., unpackaged semiconductor die) that is formed as part of a larger wafer. For example, the semiconductor die 200 may be a logic die (e.g., application processor (AP), central processing unit, microcontroller, etc.), a memory die (e.g., dynamic random access memory (DRAM) die, hybrid memory cube (HBC), a static random access memory (SRAM) die, a wide input/output (wideIO) memory die, a magnetoresistive random access memory (mRAM) die, a resistive random access memory (rRAM) die, etc.), a power management die (e.g., power management integrated circuit (PMIC) dies), a radio frequency (RF) die, a sensor die, a micro-electro-mechanical-system (MEMS) die, a signal processing die (e.g., digital signal processing (DSP) die), a front-end die (e.g., analog front-end (AFE) die), a biomedical die, or the like.

The semiconductor die 200 may be processed according to applicable manufacturing processes to form integrated circuits in the semiconductor die 200. For example, the semiconductor die 200 may include a semiconductor substrate 202, such as silicon, doped or undoped, or an active layer of a semiconductor-on-insulator (SOI) substrate. The semiconductor substrate 202 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active and/or passive devices, such as transistors, diodes, capacitors, resistors, etc., may be formed in and/or on the semiconductor substrate 202. The devices may be interconnected by an interconnect structure 206 comprising, for example, metallization patterns 206A in one or more dielectric layers 206B on the semiconductor substrate 202. The interconnect structures 206 electrically connect the devices on the substrate 202 to form one or more integrated circuits. In various embodiments, the devices include circuit components 204 that generate relatively high levels of heat during operation. Regions of the die corresponding to (e.g., overlapping) the components 204 may be referred to as thermal hotspots in some embodiments. The components 204 may provide specific functionality, such as serializer/deserializer (SerDes) functionality, input/output (I/O) signal functionality, or the like.

The semiconductor die 200 further includes through vias 218, which may be electrically connected to the metallization patterns 206A in the interconnect structure 206. The through vias 218 may comprise a conductive material (e.g., copper, or the like) and may extend from the interconnect structure 206 into the substrate 202. One or more insulating barrier layers 220 may be formed around at least portions of the through vias 218 in the substrates 202. The insulating barrier layers 220 may comprise, for example, silicon oxide, silicon nitride, silicon oxynitride, or the like, and may be used to physically and electrically isolate the through vias 218 from the substrate 202. In subsequent processing steps, the substrate 202 may be thinned to expose the through vias 218 (see FIG. 2). After thinning, the through vias 218 provide electrical connection from a back side of the substrate 202 to a front side of the substrate 202. In various embodiments, the backside of the substrate 202 may refer to a side of the substrate 202 opposite to the devices and the interconnect structure 206 while the front side of the substrate 202 may refer to a side of the substrate 202 on which the devices and the interconnect structure 206 are disposed.

The semiconductor die 200 further comprises contact pads 210, which allow connections to be made to the interconnect structure 206 and the devices on the substrate 202. The contact pads 210 may comprise copper, aluminum (e.g., 28K aluminum), or another conductive material. A passivation film 212 is disposed on the interconnect structure 206, and the contact pads 210 are exposed at a top surface of the passivation film 212. The passivation film 212 may comprise silicon oxide, silicon oxynitride, silicon nitride, or the like. In some embodiments, the contact pads 210 may extend above a top surface of the passivation film 212.

The semiconductor die 200 may be formed as part of a larger wafer (e.g., connected to other semiconductor die 200). In some embodiments, the semiconductor die 200 may be singulated from each other after packaging. For example, the semiconductor die 200 may be packaged while still connected as part of a wafer. In other embodiments, the semiconductor die 200 may be packaged after it has been singulated from other components of the wafer. In some embodiments, a chip probe (CP) test may be applied to each of the semiconductor die 200 (e.g., through the contact pads 210). The CP test checks electrical functionality of the semiconductor die 200, and dies that pass the CP tests are referred to as known good dies (KGDs). Semiconductor dies 200 that do not pass the CP tests are discarded or repaired. In this manner, KGDs are provided for packaging, which reduces waste and expense of packaging a faulty die.

After the CP tests, a dielectric layer 214 is formed over the contact pads 210 and the interconnect structure 206 of each KGD. The dielectric layer 214 may comprise silicon oxide, silicon oxynitride, silicon nitride, or the like. The dielectric layer 214 may protect the contact pads 210 during subsequent packaging processes. In some embodiments, additional interconnection between the contact pads 210 may be provided by metallization patterns 216, which are disposed in the dielectric layer 214.

Figure 1B:
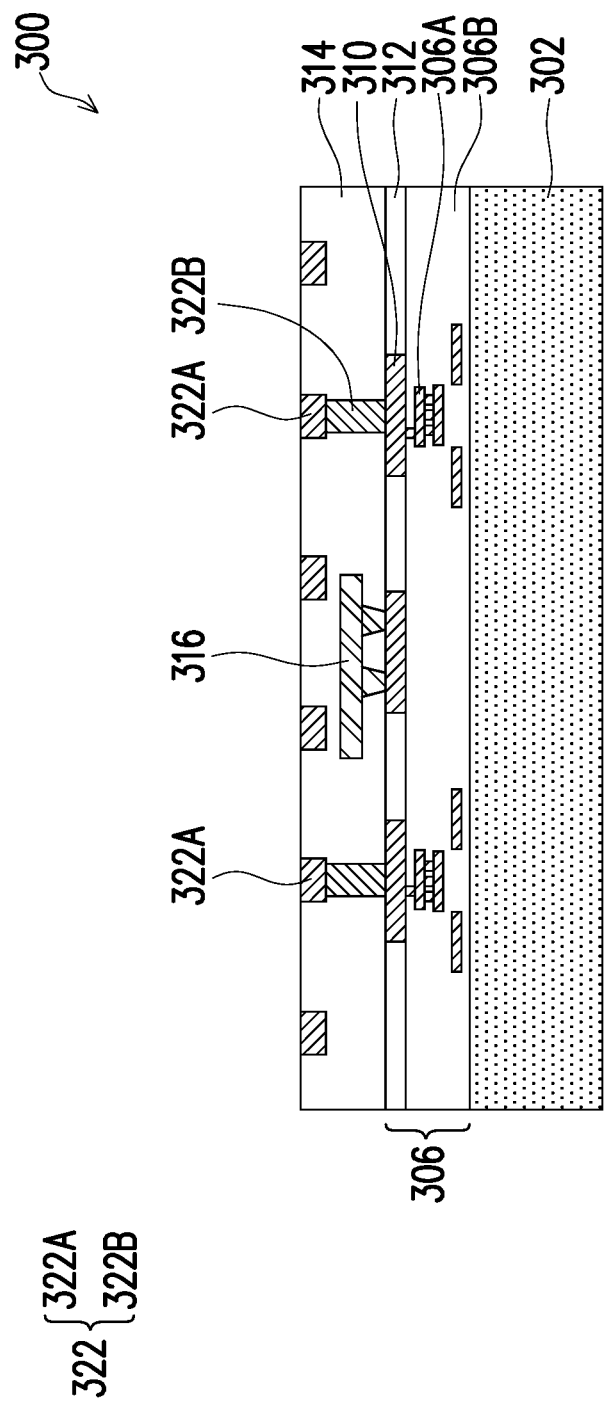

In FIG. 1B, a second semiconductor die 300 that will be subsequently bonded to the semiconductor die 200 is illustrated. The materials and formation processes of the features in the semiconductor die 300 may be found by referring to the like features in the semiconductor die 200, with the like features in the semiconductor die 200 starting with number "2," which features correspond to the features in the semiconductor die 300 and having reference numerals starting with number "3." For example, the semiconductor die 300 may include a semiconductor substrate 302 having devices (e.g., transistors, capacitors, diodes, resistors, or the like) formed thereon and an interconnect structure 306. The interconnect structure 306 includes metallization patterns 306A in one or more dielectric layers 306B, and the metallization patterns 306A electrically connects the devices on the substrate 300 into functional circuits. The interconnect structure 306 further includes a passivation layer 312 and contact pads 310 that are electrically connected to the metallization patterns 306A. A dielectric layer 314 may be disposed over the contact pads 310 and the passivation layer 312. Metallization patterns 316 may provide interconnection between the bond pads 310 within the dielectric layer 314. The semiconductor die 300 may further include connection structures 322 (e.g., comprising bond pads 322A and bond pad vias 322B) in the dielectric layer 314. The bond pads 322A are electrically connected to the contact pads 310 by the bond pad vias 322B, and the contact pads 310 may electrically connect the connection structures 322 to the circuits of the semiconductor die 300. The bonding pads 322A and the bond pad vias 322B may be formed by a damascene process, for example, and a planarization process may be performed to level top surfaces of the connection structures 322 with the dielectric layer 314. In some embodiments, the semiconductor die 300 may not include any through vias that extend into the substrate 302. In a specific embodiment, the semiconductor die 300 is a memory die, but other types of dies may be used as well.

In some embodiments, the semiconductor die 300 may also be formed initially as part of a larger wafer comprising a plurality of semiconductor dies 300. After formation, a singulation process may be applied to separate the semiconductor die 300 from other dies in the wafer. The semiconductor die 300 may then be bonded to the semiconductor die 200 in subsequent process steps (see FIG. 3). In some embodiments the semiconductor die 300 is bonded while the semiconductor die 200 is still attached to a wafer in a chip on wafer (CoW) packaging process. Other packaging processes may be used in other embodiments.

Figure 2:
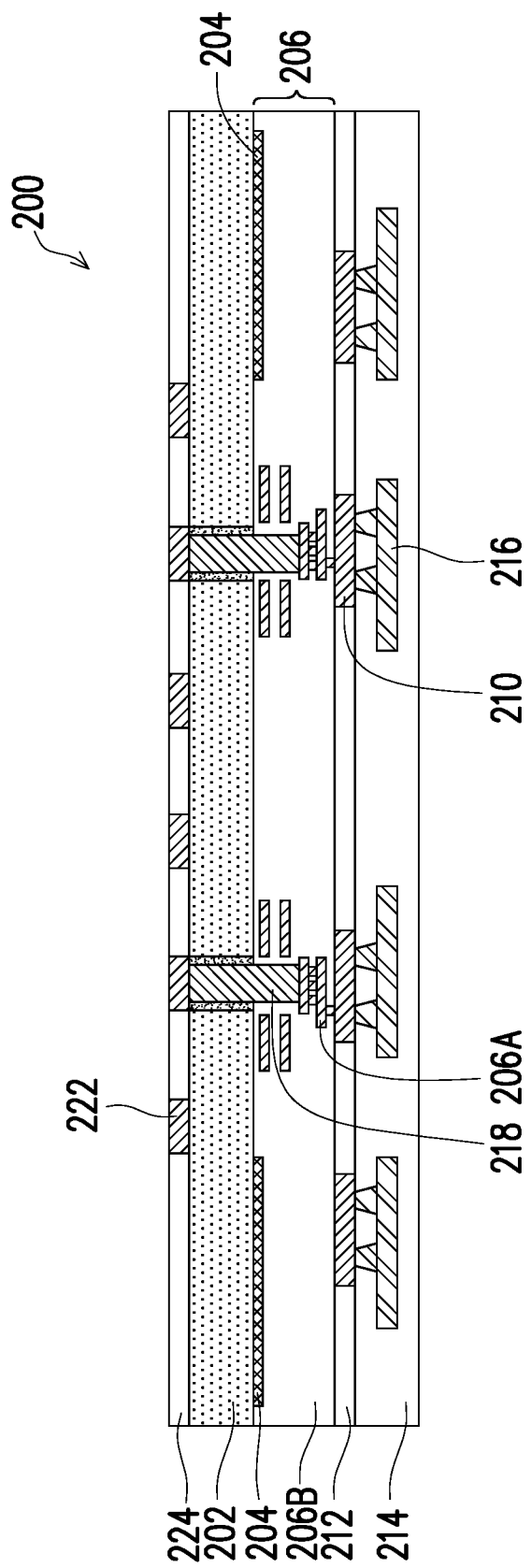

In FIG. 2, a thinning process may be applied to the semiconductor die 200 to expose the through vias 218. The thinning removes portions of the substrate 202 over the through vias 218. In some embodiments, the thinning may further remove lateral portions of a barrier layer (e.g., barrier layer 208, see FIG. 1A) on the through vias 218 to expose the through vias 218. The thinning process may comprise performing a chemical mechanical polish (CMP), grinding, an etch back (e.g., a wet etch), combinations thereof, or the like. In the illustrated embodiments, the thinning process results in a backside of the substrate 202 being level with a lateral surface of the through vias 218. In some embodiments, the thinning process may recess the substrate 202 such that the through vias 218 extend beyond a back surface of the substrate 202. This can be achieved, for example, through a selective etching process that selectively etches the substrate 202 without significantly etching the through vias 218. In some embodiments, the semiconductor die 200 may be attached to a temporary carrier substrate (not explicitly illustrated) during the thinning process for increased mechanical support.

As further illustrated by FIG. 2, a dielectric layer 224 is deposited over the substrate 202. The dielectric layer 224 may comprise silicon oxide, silicon nitride, silicon oxynitride, or the like, and the dielectric layer 224 may be deposited using a suitable deposition process such as chemical vapor deposition (CVD), physical vapor deposition (PVD), atomic layer deposition (ALD), or the like. The material of the dielectric layer 224 may be selected so that it is suitable for direct fusion bonding to the dielectric layer 314 in subsequent process steps (e.g., see FIG. 3). Bond pads 222 may be formed and disposed in the dielectric layer 224. The bond pads 222 may be formed either before or after the dielectric layer 224 is deposited. The bond pads 222 may comprise copper or the like and be formed by a plating process, a damascene process, or the like, for example. The bond pads 222 may be electrically connected to the devices/circuits (e.g., the components 204) of the semiconductor die 200 by the through vias 218.

Alternatively, in embodiments where the through vias 218 protrude from the backside of the substrate 202, the bond pads 222 may be omitted, and the dielectric layer 224 may be formed to surround protruding portions of the through vias 218. In such embodiments, the dielectric layer 224 may be deposited to initially cover the through vias 218, and a planarization step may then be performed to substantially level surfaces of the through vias 218 and the dielectric layer 224.

Figure 3:
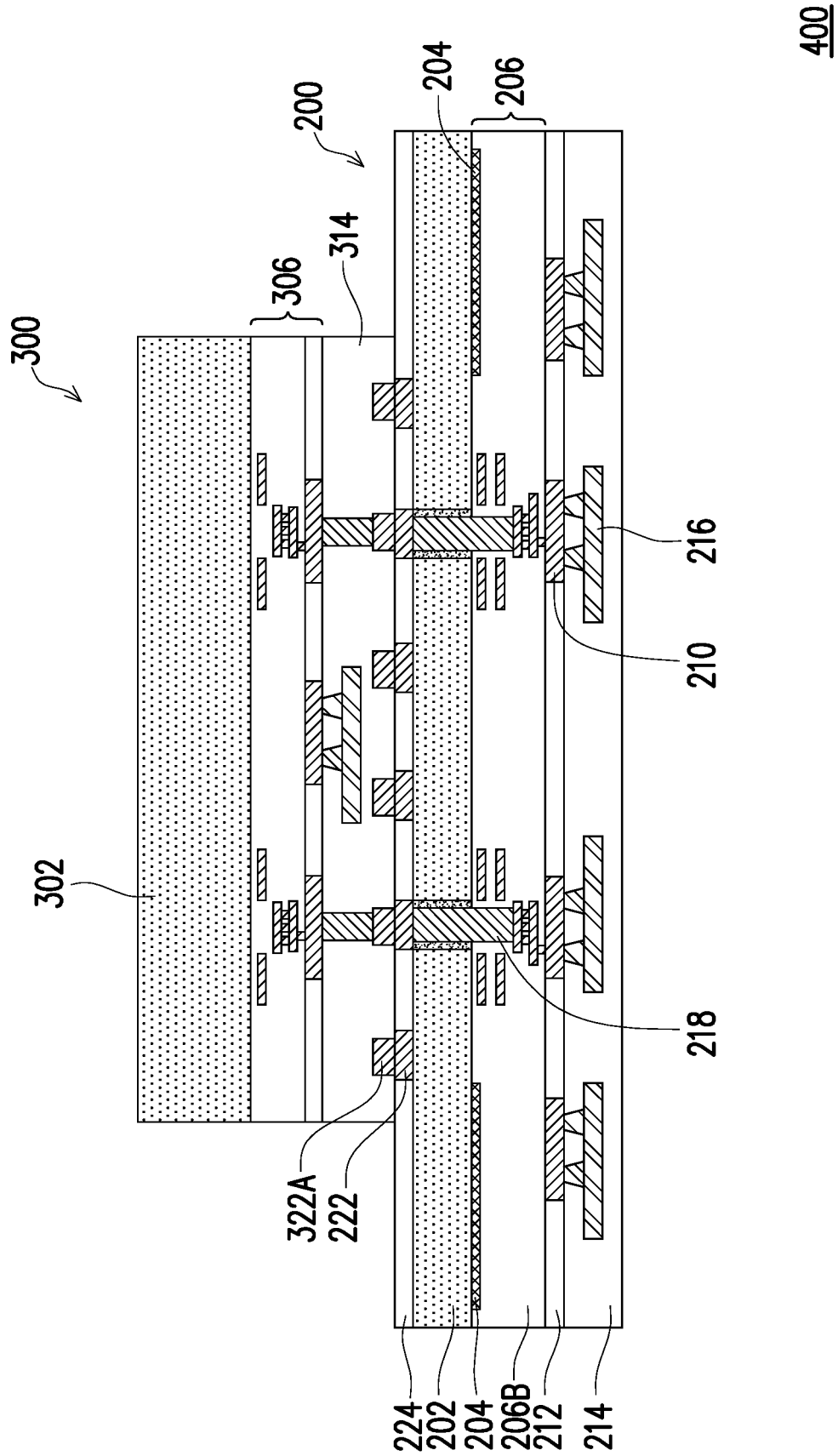
Figure 4:
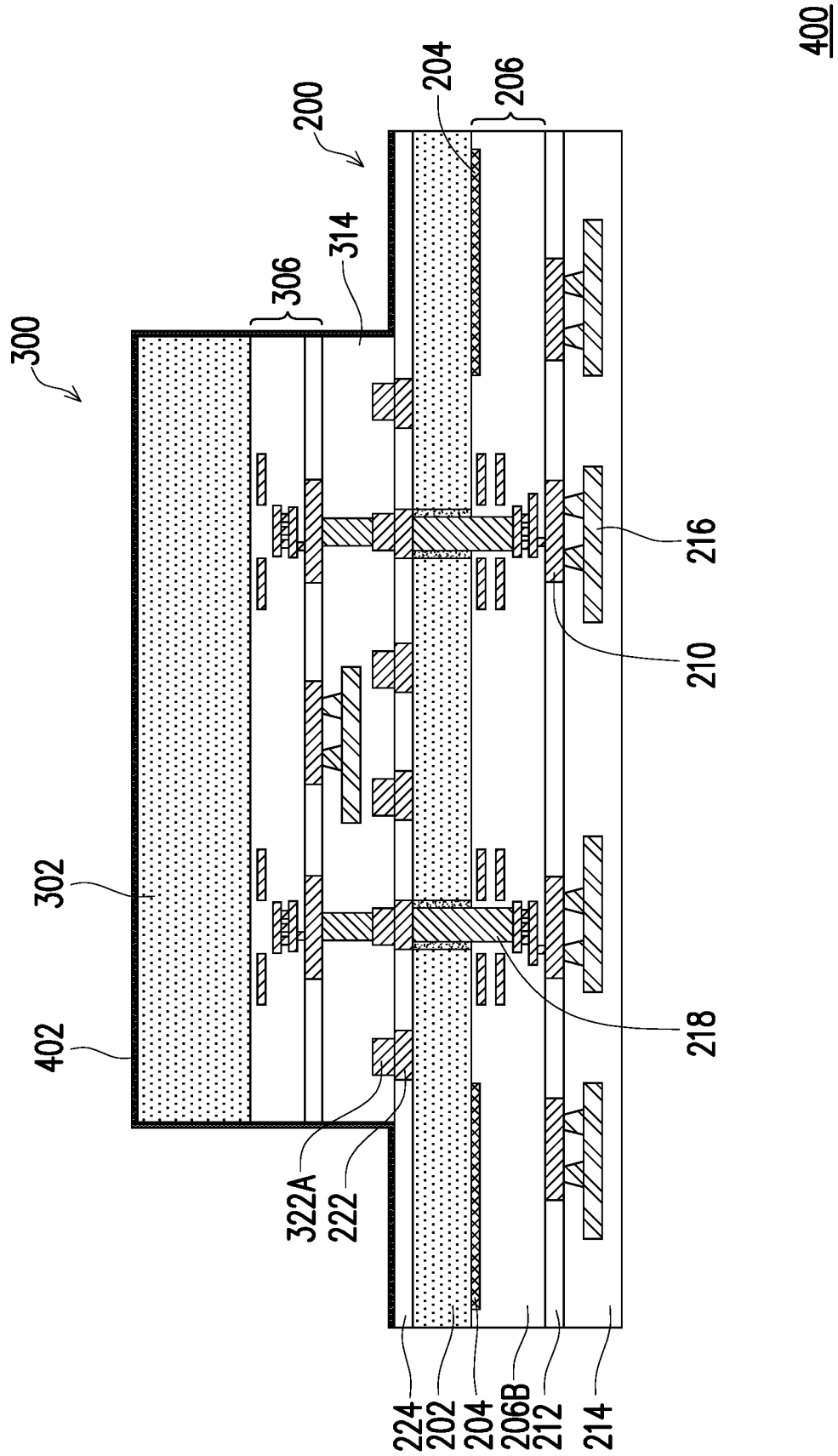

In FIG. 3, the semiconductor die 300 is bonded to the semiconductor die 200, for example, in a hybrid bonding configuration to form a package 400. The semiconductor die 300 are disposed face down such that a front side of the semiconductor die 300 faces the semiconductor die 200 and a backside of the semiconductor die 300 faces away from the semiconductor die 200. The semiconductor die 300 are bonded to the dielectric layer 224 on the back sides of the semiconductor die 200 and the bond pads 222 in the dielectric layer 224. For example, the dielectric layer 314 of the semiconductor die 300 may be directly bonded to the dielectric layer 224 of the semiconductor die 200, and bond pads 322A of the semiconductor die 300 may be directly bonded to the bond pads 222 of the semiconductor die 200. In an embodiment, the bond between the dielectric layer 314 and the dielectric layer 224 may be an oxide-to-oxide bond, or the like. The hybrid bonding process further directly bonds the bond pads 322A of the semiconductor die 300 to the bond pads 222 of the semiconductor die 200 through direct metal-to-metal bonding. Thus, electrical connection between the semiconductor die 200 and 300 can be provided by the physical connection of the bond pads 322A to the bond pads 222. In alternative embodiments where the bond pads 222 are omitted, the bond pads 322A may be directly bonded to the through vias 218 by direct metal-to-metal bonding.

As an example hybrid bonding process starts with aligning the semiconductor die 200 with the semiconductor die 300, for example, by applying a surface treatment to one or more of the dielectric layer 224 or the dielectric layer 314. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the dielectric layer 224 or the dielectric layer 314. The hybrid bonding process may then proceed to aligning the bond pad 322A to the bond pads 222 (or the through vias 218). When semiconductor die 200 and 300 are aligned, the bond pad 322A may overlap with the corresponding through vias 218. Next, the hybrid bonding includes a pre-bonding step, during which each semiconductor die 200 is put in contact with a respective semiconductor die 300. The pre-bonding may be performed at room temperature (e.g., between about 21° C. and about 25° C.). The hybrid bonding process continues with performing an anneal, for example, at a temperature between about 150° C. and about 400° C. for a duration between about 0.5 hours and about 3 hours, so that the metal in bond pad 322A (e.g., copper) and the metal of the bond pads 222 (e.g., copper) inter-diffuses to each other, and hence the direct metal-to-metal bonding is formed. Although only a single semiconductor die 300 is illustrated as being bonded to the semiconductor die 200, other embodiments may include multiple semiconductor die 300 bonded to the semiconductor die 200. In such embodiments, the multiple semiconductor die 300 may be in a stacked configuration (e.g., having multiple stacked, bonded dies 300) and/or a side-by-side configuration.

The semiconductor die 300 may have smaller surface area than the semiconductor die 200. The semiconductor die 200 extend laterally past the semiconductor die 300, and portions of the dielectric layer 224 are exposed after bonding the semiconductor die 200 and 300. By leaving a portion of the dielectric layer 224 exposed, heat dissipation features (e.g., the metallic thermal base 404 and the metallic thermal vias 406, see FIGS. 8A through 8C) may be formed to the dielectric layer 224 to overlap with the hot spots of the die 200 (e.g., the components 204).

An example of forming heat dissipation features is described below. Starting in FIG. 4, a seed layer 402 may be deposited on exposed surfaces of the dielectric layer 224, sidewalls of the semiconductor die 300, and a backside of the semiconductor die 300. In some embodiments, the seed layer 402 is a metal layer, which may be a single layer or a composite layer comprising a plurality of sub-layers formed of different materials. In some embodiments, the seed layer 402 comprises a conductive base layer and a copper layer over the base layer. The conductive base layer may comprise titanium, titanium mononitride, tantalum, tantalum mononitride, or the like. The seed layer 402 may be formed using, for example, CVD, PVD, or the like.

Figure 5A:
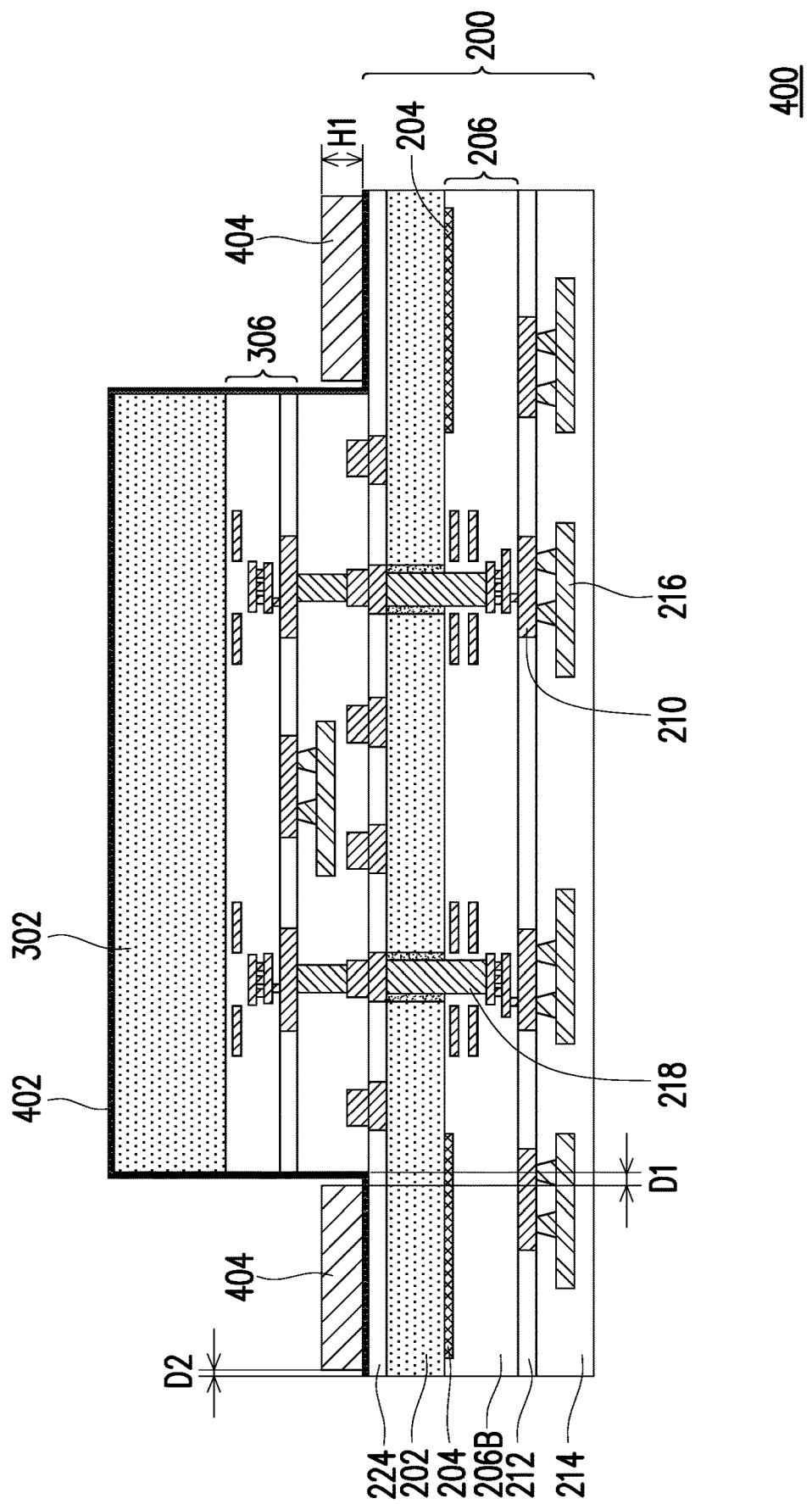
Figure 5B:
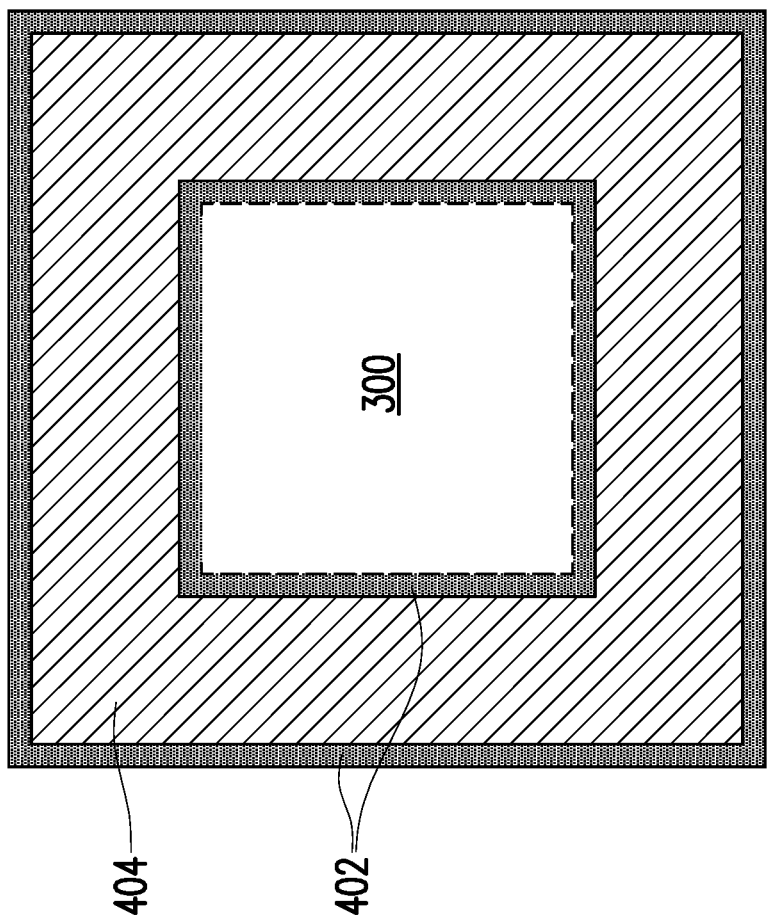

In FIGS. 5A and 5B, a metallic thermal base 404 is formed on the seed layer 402 using a first lithography and plating process. Specifically, to form the metallic thermal base 404, a photoresist (not shown) is formed and patterned on the seed layer 402. The photoresist may be formed by spin coating or the like and may be exposed to light for patterning. The pattern of the photoresist corresponds to the metallic thermal base 404. The patterning forms one or more openings through the photoresist to expose the seed layer 402. The metallic thermal base 404 is formed in the openings of the photoresist and on the exposed portions of the seed layer 402. The metallic thermal base 404 may be formed by plating, such as electroplating or electroless plating, or the like. The metallic thermal base 404 may be made of a metal, like copper, titanium, tungsten, aluminum, or the like. By forming the metallic thermal base 404 out of a metal, heat dissipation in the package 400 can be improved due to the relatively high thermal conductivity of metal. In some embodiments, the metallic thermal base 404 may have a minimum thermal conductivity of 400 W/mK to provide sufficient heat dissipation in embodiment packages. Then, the photoresist is removed by an acceptable ashing or stripping process, such as using an oxygen plasma or the like. The metallic thermal base 404 may be electrically isolated from any devices in the semiconductor die 300 and/or the semiconductor die 200.

The metallic thermal base 404 may continuously and fully surround the semiconductor die 300 in a plan view (see FIG. 5B illustrating the location of the semiconductor die 300 in with dashed lines). Further, the thermal base may overlap hotspots of the semiconductor die 200 (e.g., the components 204) to facilitate heat dissipation away from the semiconductor die 300. Other configurations of the metallic thermal base 404 are also possible. In some embodiments, the metallic thermal base 404 may have a height H1 that is in a range of about 5 µm to about 180 µm. Further, the metallic thermal base 404 may be spaced laterally apart from the semiconductor die 300 by a distance D1 and also spaced laterally apart from a boundary of the semiconductor die 200 by a distance D2. The distances D1 and D2 may each be in a range of 10 µm to about 200 µm, and the distance D1 may or may not be equal to the distance D2. Other dimensions/spacing of the metallic thermal base 404 are also possible in other embodiments.

Figure 6:
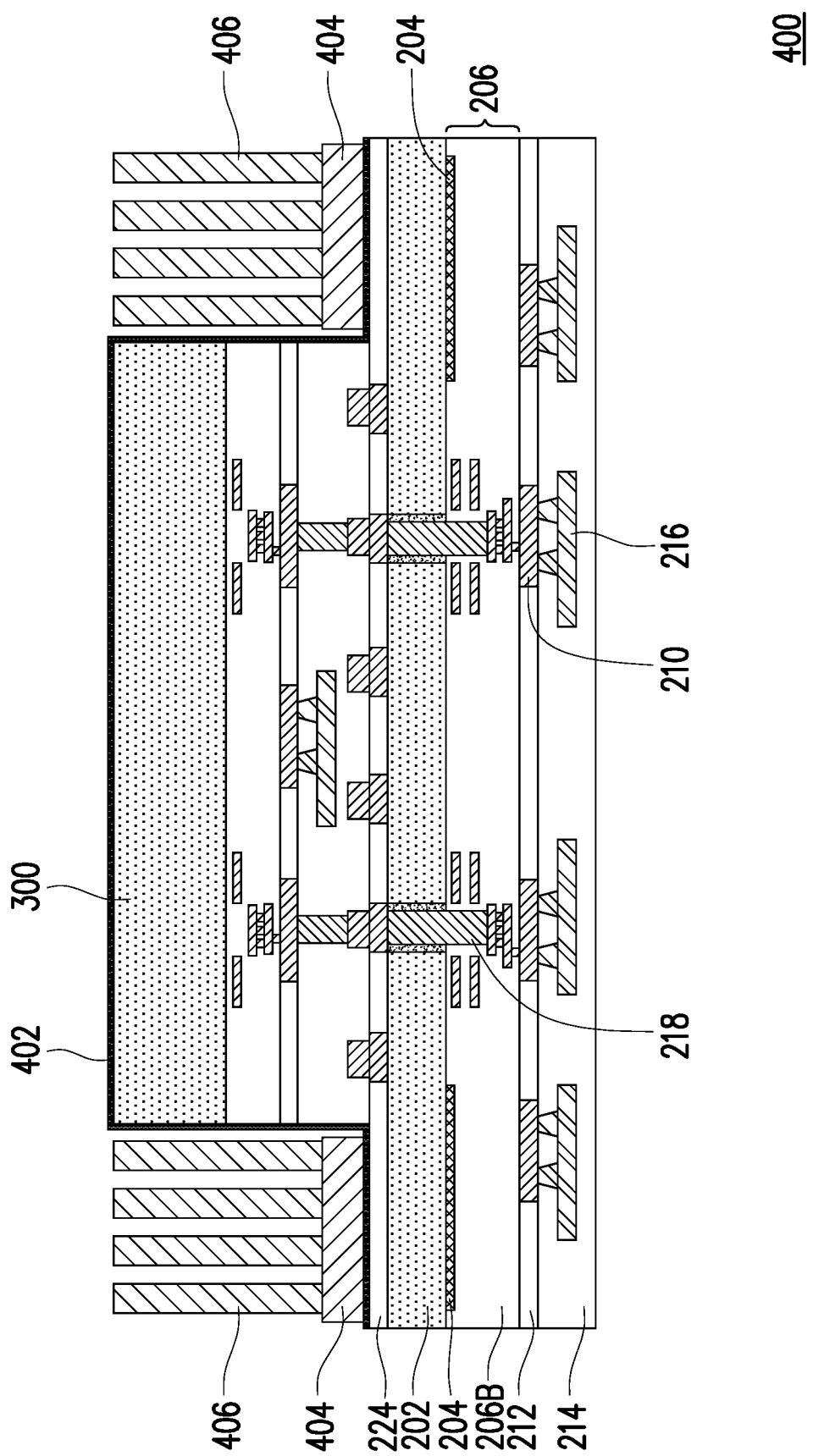

In FIG. 6, forming the heat dissipation feature in the package 400 continues with forming metallic thermal vias 406 on the metallic thermal base 404 using a second lithography and plating process. To form the metallic thermal vias 406, a photoresist (not shown) is formed and patterned on the metallic thermal base 404. The photoresist may be formed by spin coating or the like and may be exposed to light for patterning. The pattern of the photoresist corresponds to the metallic thermal vias 406. The patterning forms one or more openings through the photoresist to expose the metallic thermal base 404. The metallic thermal vias 406 are formed in the openings of the photoresist and on the exposed portions of the metallic thermal base 404. The metallic thermal vias 406 may be formed by plating, such as electroplating or electroless plating, or the like. The metallic thermal vias 406 may be made of a metal, like copper, titanium, tungsten, aluminum, or the like. By forming the metallic thermal vias 406 out of a metal, heat dissipation in the package 400 can be improved due to the relatively high thermal conductivity of metal. In some embodiments, the metallic thermal vias 406 may have a minimum thermal conductivity of 400 W/mK to provide sufficient heat dissipation in embodiment packages. The metallic thermal vias 406 may or may not have a same material composition as the metallic thermal base 404. Each of the metallic thermal vias 406 may have a cross-sectional width W1 in a range of about 5 µm to about 50 µm. Other dimensions are possible in other embodiments. Then, the photoresist is removed by an acceptable ashing or stripping process, such as using an oxygen plasma or the like. As illustrated by FIG. 6, no separate seed layer needs to be deposited over the metallic thermal base 404 to form the metallic thermal vias 406. That is, the plating process may utilize the metallic thermal base 404 in a manner to form the metallic thermal vias 406 where no separate seed layer is required, which reduces manufacturing costs.

Figure 7:
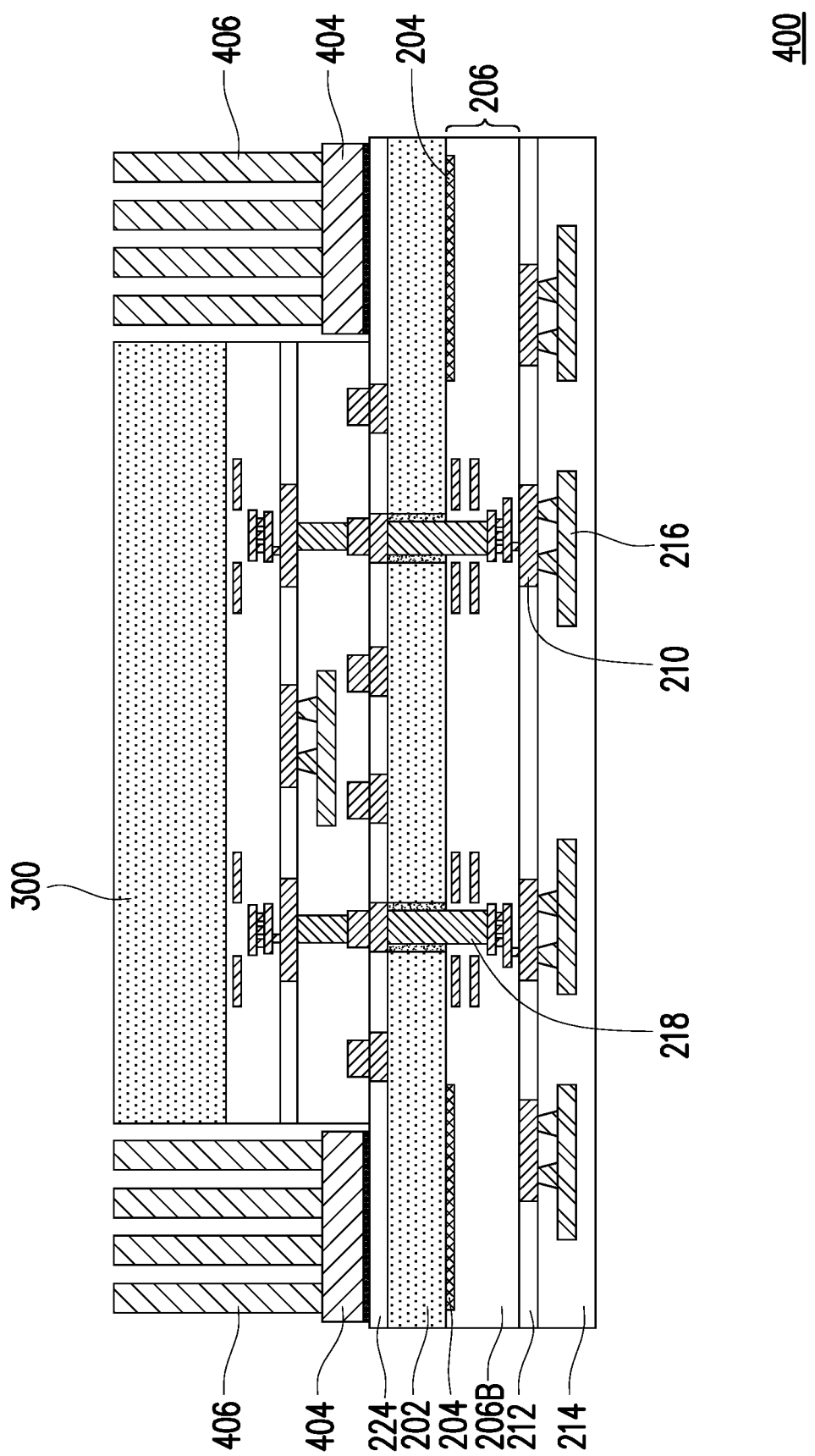

In FIG. 7, excess portions of the seed layer 402 are removed. Specifically, portions of the seed layer 402 that are not covered by the metallic thermal base 404 may be removed, such as portions of the seed layer 402 on a back side of the semiconductor die 300, the sidewalls of the semiconductor die 300, and portions of the semiconductor die 200 not covered by the base 404. The seed layer 402 may be removed by any suitable dry and/or wet etching process(es). As a result, a heat dissipation feature comprising remaining portions of the seed layer 402, the metallic thermal base 404, and the metallic thermal vias 406 are formed in the package 400. The heat dissipation feature may be electrically isolated from the dies 200 and 300. For example, the dielectric layer 224 may cover an entire bottom surface of the heat dissipation feature.

Figure 8A:
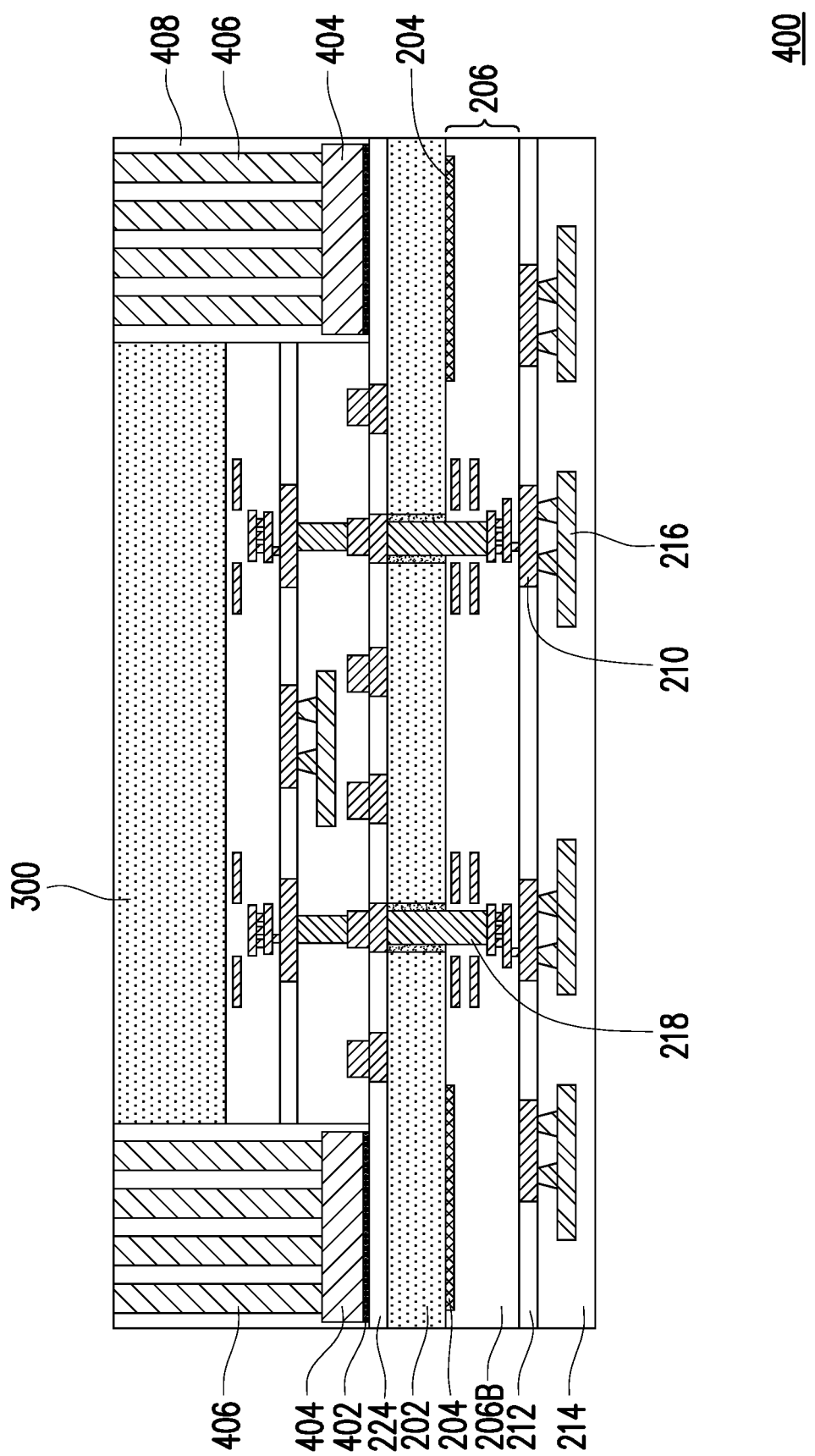
Figure 8C:
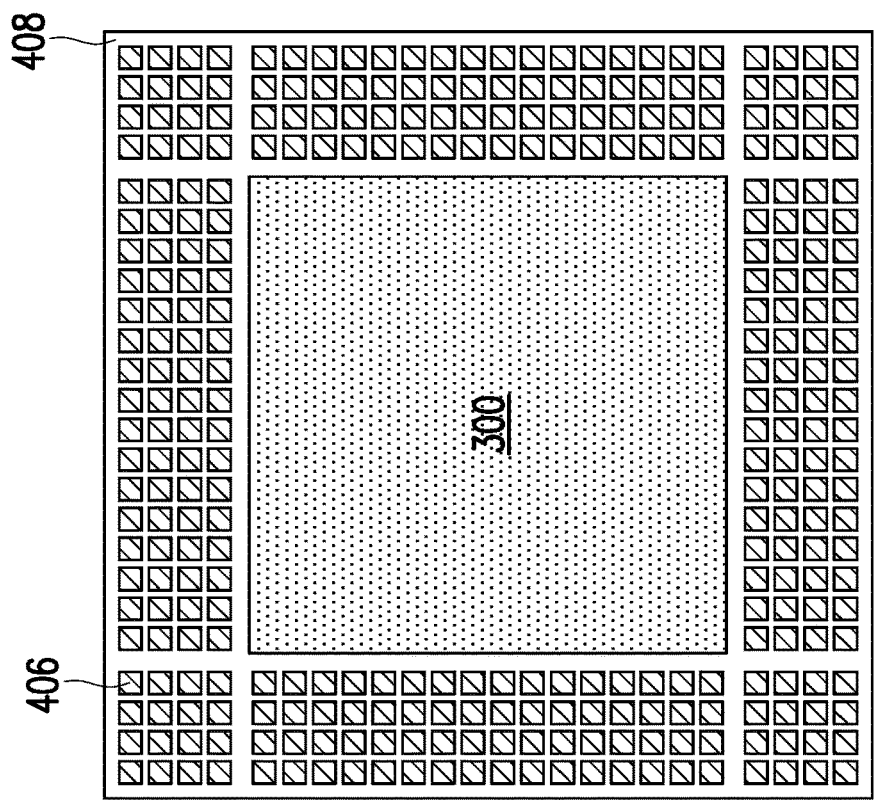
Figure 8B:
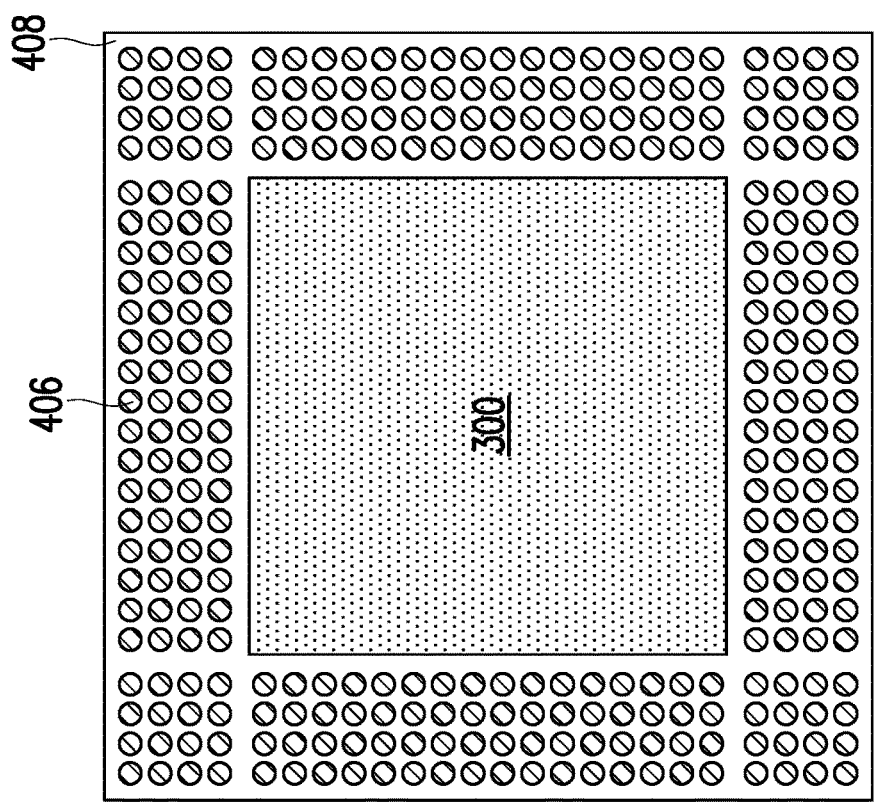

In FIG. 8A through 8C, an insulating material 408 is formed over the semiconductor die 200, around the semiconductor die 300, and around the metallic thermal base 404/metallic thermal vias 406. In some embodiments, the insulating material 408 is a molding compound (e.g., an epoxy, a resin, a moldable polymer, or the like) shaped or molded using for example, a mold (not shown) which may have a border or other feature for retaining insulating material 408 when applied. Such a mold may be used to pressure mold the insulating material 408 around the semiconductor die 300 to force the insulating material 408 into openings and recesses, eliminating air pockets or the like in the insulating material 408.

In some embodiments, the insulating material 408 is a dielectric material (e.g., an oxide, nitride, oxynitride, or the like), a polymer material (e.g., polyimide or the like), spin on glass (SOG), or the like that is deposited over the semiconductor die 200. In such embodiments, insulating material 408 may be formed by PVD, CVD, or another process. As also illustrated by FIG. 8A, the insulating material 408 may be planarized by, e.g., a grinding, chemical-mechanical polish (CMP) process, or the like. After planarization, top surfaces of the insulating material 408, the semiconductor die 300, and the metallic thermal vias 406 are substantially level.

The heat dissipation features in the package 400 (e.g., the metallic thermal base 404 and the metallic thermal vias 406) provide heat dissipation from surfaces of the semiconductor die 200 through the insulating material 408. Various embodiments may achieve improved thermal dissipation from hotspots (e.g., components 204) in the semiconductor die 200 from the use of a high thermal conductivity material (e.g., metal) in the metallic thermal base 404 and the metallic thermal vias 406. Further, the two step lithography and plating processes of forming the metallic thermal base 404 and the metallic thermal vias 406 allow them to be adaptable based on a desired configuration of the package 400 and a shape/size of the semiconductor die 300 while still providing excellent thermal dissipation. For example, a size of metallic thermal base 404 may be adapted based on a size and/or shape of the semiconductor die 300 without significant adjustments to the manufacturing process. As another example, the metallic thermal vias 406 may have specific shapes in a top-down view based on a desired configuration of the package 400. For example, each of the through vias 406 may have a circular shape in a top-down view as illustrated by FIG. 8B, or each of the through vias 406 may have a rectangular/square shape in a top-down view as illustrated by FIG. 8C. Other shapes of the metallic thermal vias 406 are also possible. In some embodiments, the two step lithography and plating process allows for a larger thermal base 404 to be formed for improved coverage and heat dissipation while having smaller metallic thermal vias 406 to reduce an overall volume of metal in the encapsulant 408. Because the overall volume of metal in the encapsulant 408 is reduced, a thermal coefficient of expansion of the semiconductor die 300/encapsulant 408 is reduced (e.g., maintained around the same level as the underlying semiconductor die 200), thereby reducing mechanical stress in the completed package.

Further processing steps may be applied to the package 400. For example, one or more singulation processes may be applied to separate the semiconductor die 200 from other semiconductor dies in its wafer. The singulation process may include sawing, dicing, or the like. For example, the singulation process can include sawing the encapsulant 408, the dielectric layer 224, the substrate 202, the interconnect structure 206, and the dielectric layer 214. Further, a heat dissipating lid and/or heat spreader may be attached to a backside of the semiconductor die 300, the encapsulant 408, and the metallic thermal vias 406 by a thermal interfacing material (TIM) for additional heat dissipation.

Figure 9A:
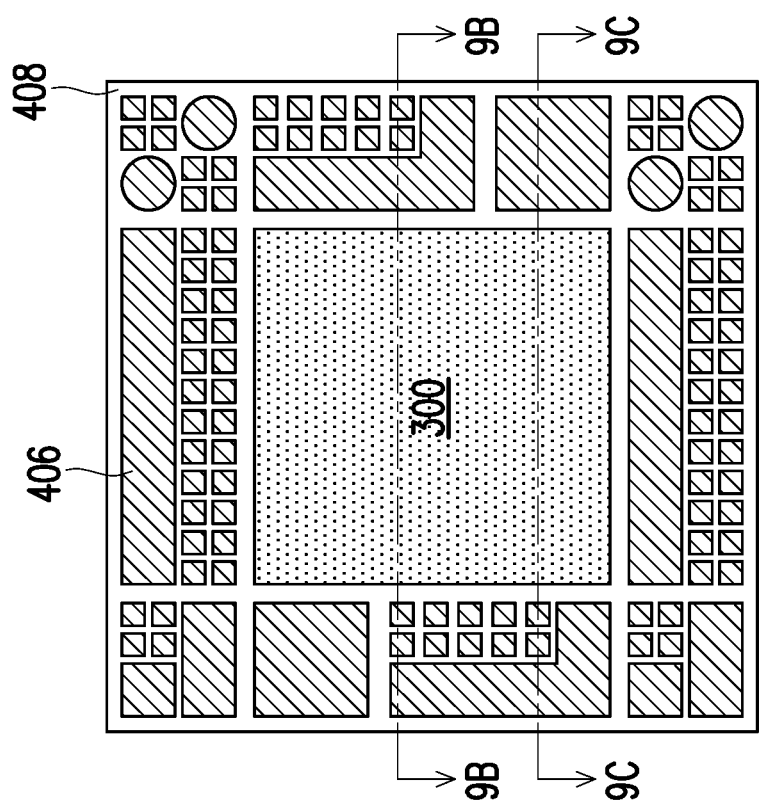
FIGS. 9A, 9B, and 9C illustrate cross-sectional and top-down views of a semiconductor package according to some embodiments.
Figure 9B:
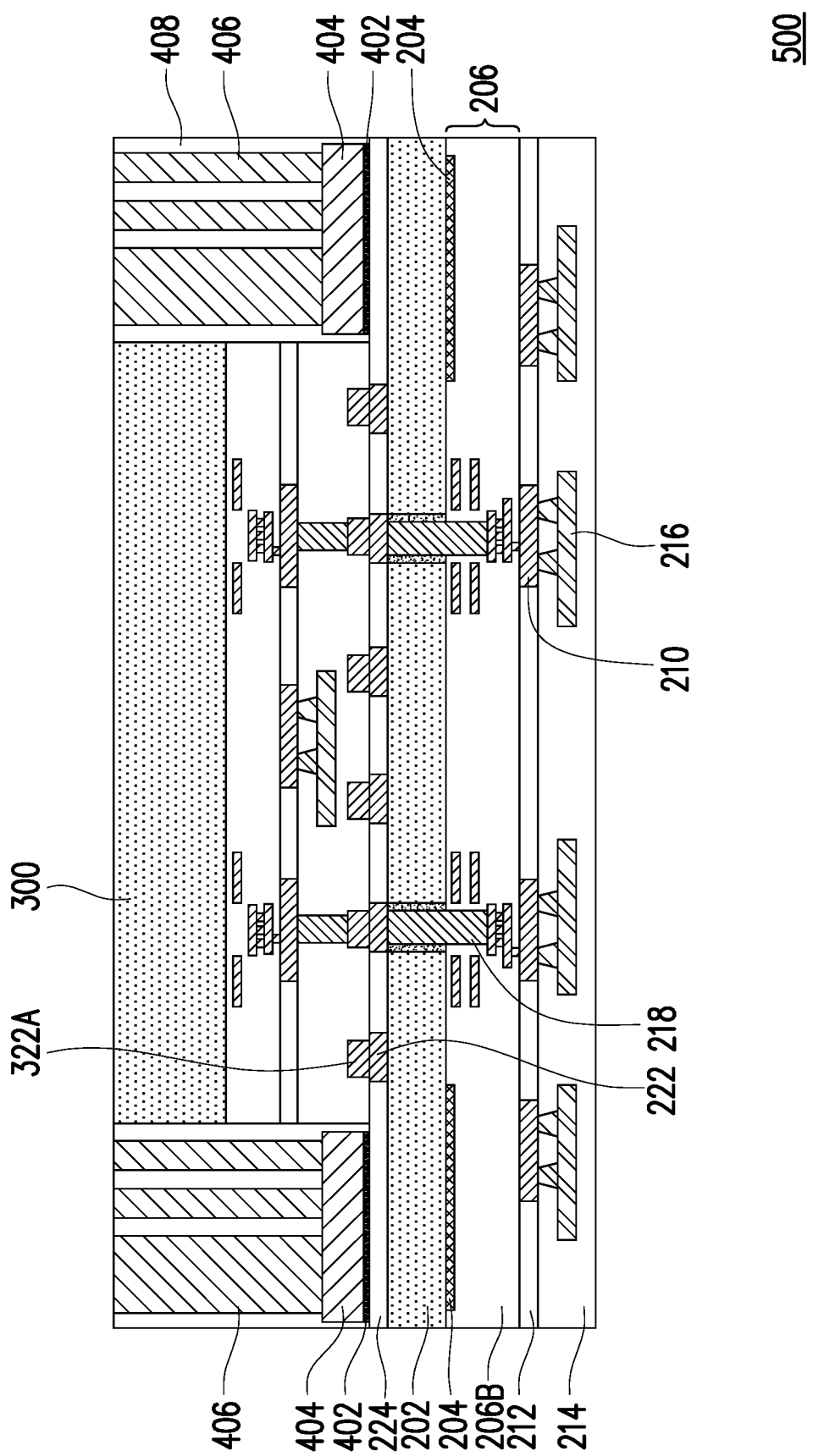
Figure 9C:
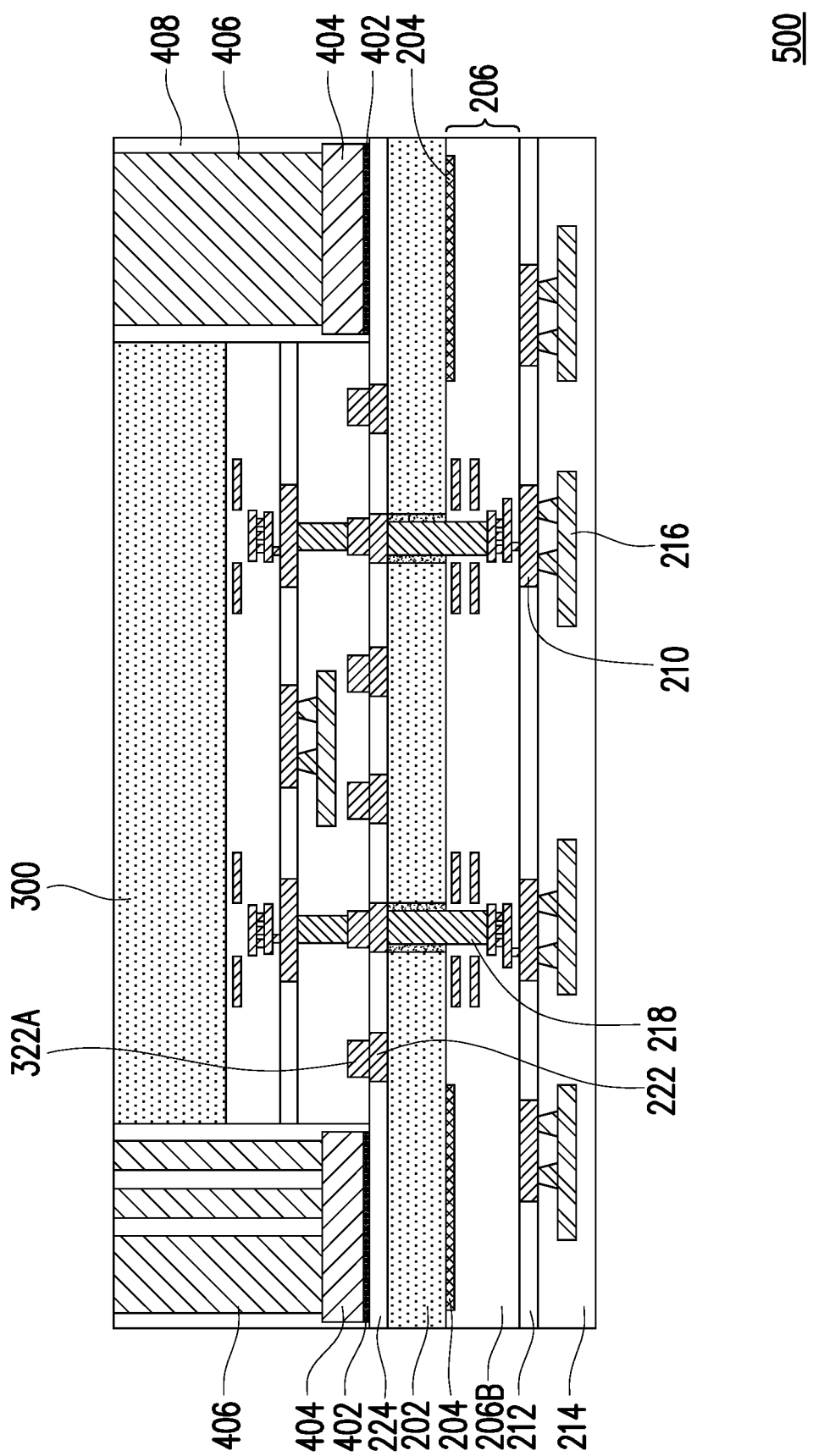

The heat dissipation features may be adapted into various different configurations. For example, although package 400 include metallic thermal vias 406 of a uniform shape, size, and/or pitch, other configurations are also possible. FIGS. 9A through 9C illustrate a package 500 according to some embodiments. The package 500 may be similar to the package 400 where like reference numerals indicate like elements formed by like processes. FIG. 9A illustrates a top down view of the package 500; FIG. 9B illustrates a cross-section along line B-B of FIG. 9A; and FIG. 9C illustrates a cross-section along line C-C of FIG. 9A. As shown in FIGS. 9A through 9C, the metallic thermal vias 406 may have a varying sizes and/or shapes. Particular metallic thermal vias 406 may occupy a larger surface area/have a larger width than others of the metallic thermal vias 406. Further, a single package may include metallic thermal vias 406 which are a combination of round (e.g., circular), rectangular, square, and L-shaped in the shape. Further a spacing between adjacent thermal vias in the package 500 may vary as well. The size, shape, and/or spacing of each of the metallic thermal vias 406 may be adapted based on a desired configuration of the package 500. For example, metallic thermal vias 406 may overlap hotspots, and a size and/or shape of each of the metallic thermal vias 406 may correspond to a size and/or shape of a corresponding hot spot. In this manner, the manufacturing process may be adapted to form a variety of different packages with different thermal dissipation configurations. The manufacturing process need to be adjusted significantly to achieve different package configurations.

Figure 10:
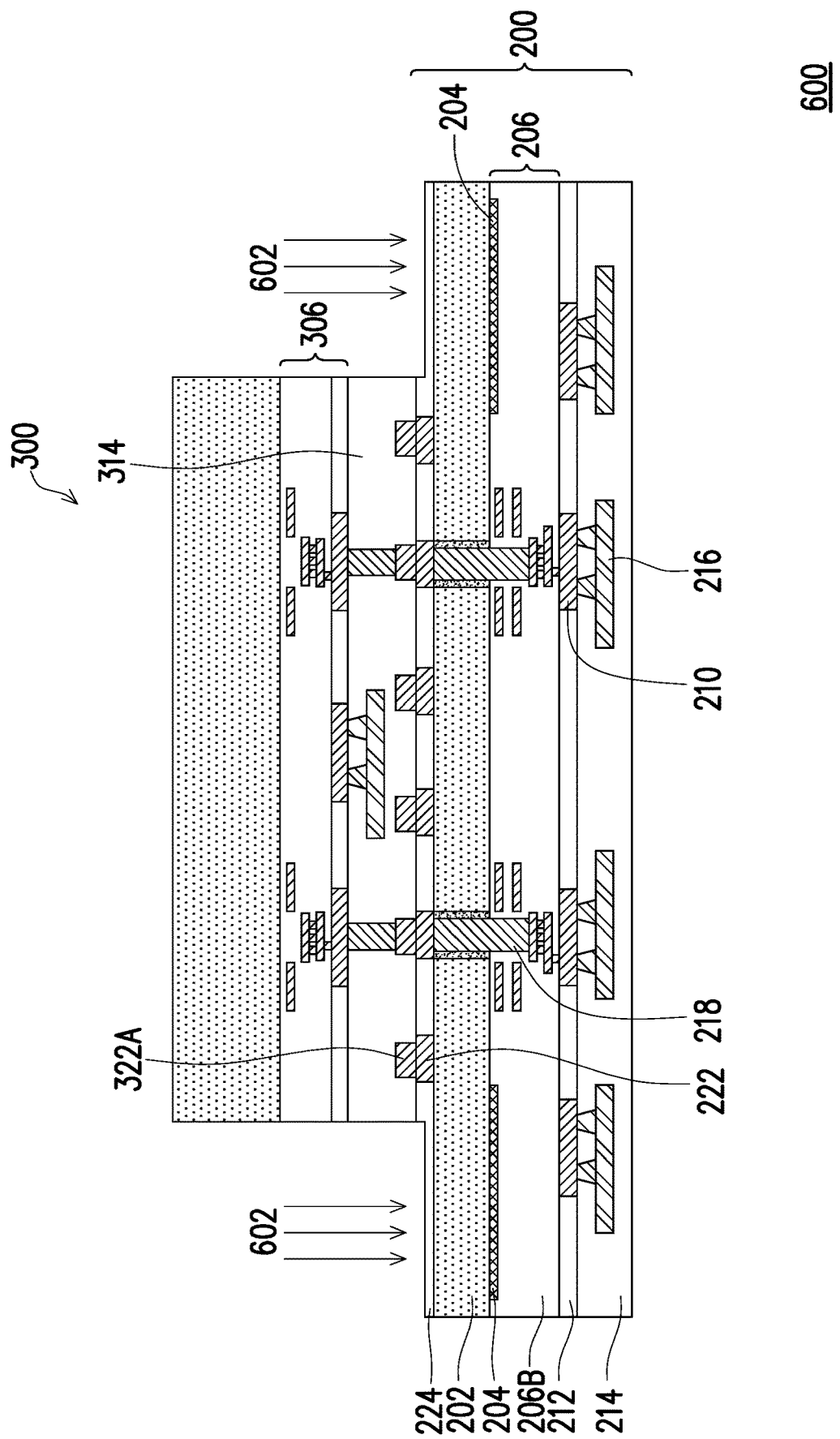
FIGS. 10, 11A, and 11B illustrate cross-sectional views of manufacturing an semiconductor package according to some embodiments.
Figure 11A:
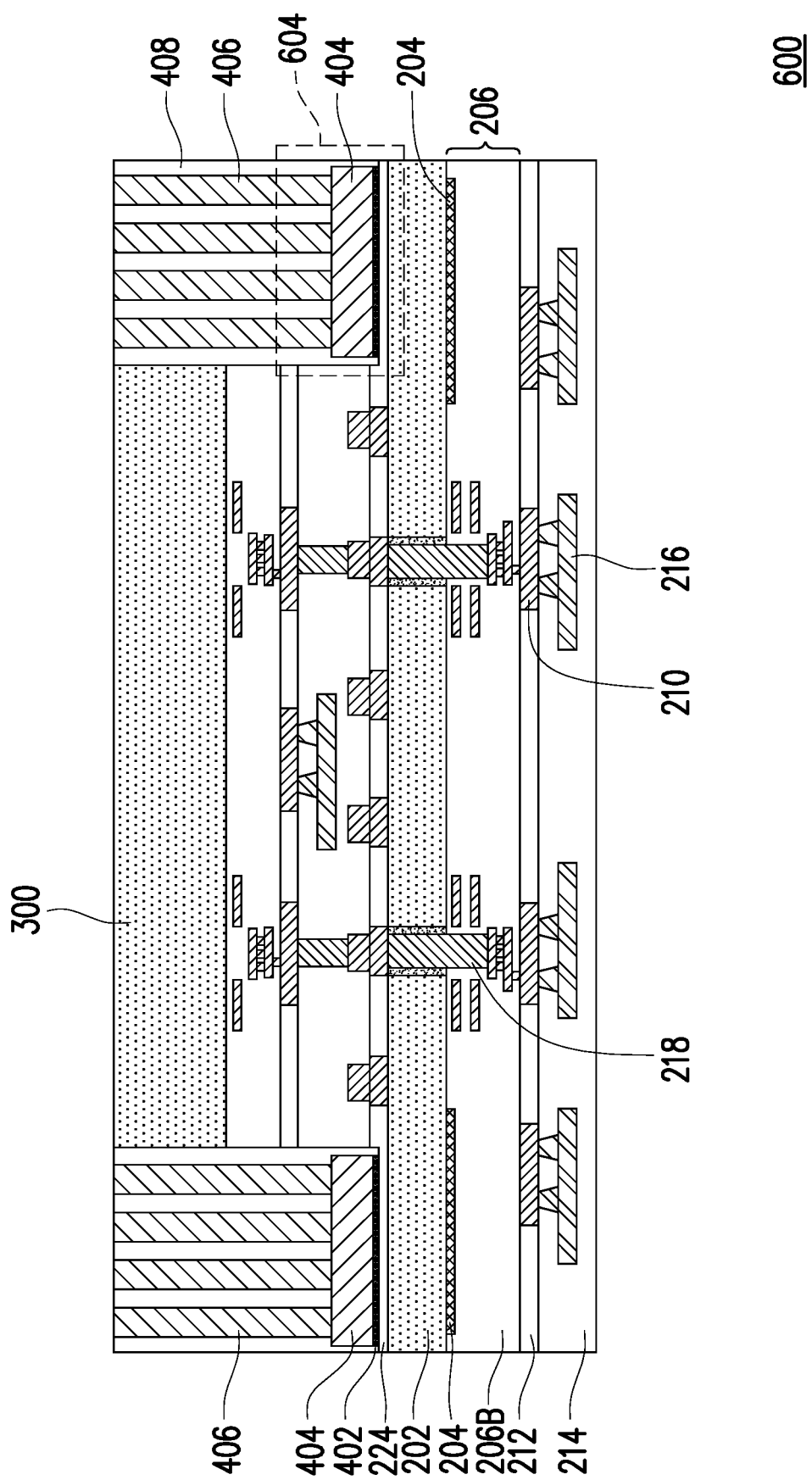
Figure 11B:
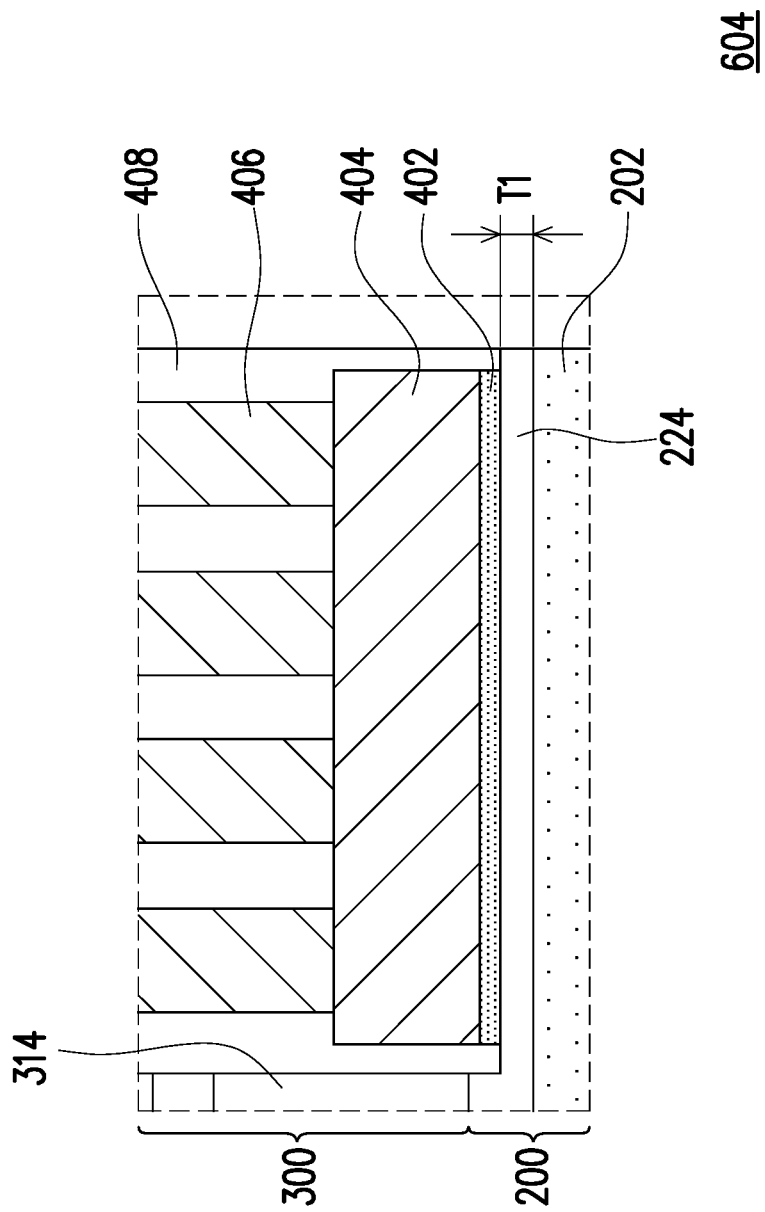

FIGS. 10, 11A, and 11B illustrate cross-sectional views of various stages of manufacturing a semiconductor package 600 according to some embodiments. The package 600 may be similar to the package 400 where like reference numerals indicate like elements formed by like processes. FIG. 10 illustrates a cross-sectional view following further processing after the dies 300 and 200 are directly bonded together as described above with respect to FIG. 3.

In FIG. 10, an etch back process 602 is performed to recess exposed surfaces of the dielectric layer 224 such as the surfaces of the dielectric layer 224 not covered by the semiconductor die 300. The etch back process 602 may be a dry etch process (e.g., a plasma etch), a wet etch process (e.g., using diluted hydrogen fluoride (dHF)), or the like. The etch back process 602 may be anisotropic. In some embodiments, the etch back process 602 may utilize an optional lithography mask to cover the semiconductor die 300 during etching. The etching results in exposed portions of the dielectric layer 224 being thinner than portions of the dielectric layer 224 that is covered by the semiconductor die 300.

FIGS. 11A and 11B illustrate the package 600 after additional processing is performed to form heat dissipation features including a metallic thermal base 404 and metallic thermal vias 406 on the etched, dielectric layer 224. FIG. 11B illustrates detailed cross-sectional view of region 604 of FIG. 11A. Forming the metallic thermal base 404 and the metallic thermal vias 406 may be performed using similar process steps and materials as described above in FIGS. 4 through 7. Specifically, a two lithography and plating processes may be used to plate the metallic thermal base 404 and the metallic thermal vias 406 successively on a seed layer 402. Then excess portions of the seed layer 402 may be removed, resulting in heat dissipation features that comprise remaining portions of the seed layer 402, the metallic thermal base 404, and the metallic thermal vias 406.

Due the thinning of the dielectric layer 224 described above, the heat dissipation features may be spaced in closer proximity to the hot spots of the semiconductor die 200 (e.g., the components 204). For example, the heat dissipation features (specifically, the base 404 and the seed layer 402) may extend lower than the die 300. In this manner, heat dissipation in the package 600 may be further improved through the removal of portions of the dielectric layer 224, which has relatively poor thermal conductivity and allowing the heat dissipation feature to be placed in closer proximity to hot spots in the die 200. In the resulting structure, the dielectric layer 224 may have a thickness T1 under the heat dissipation features as illustrated by the detailed view of FIG. 11B. The thickness T1 may be in a range of about 0.1 µm to about 3 µm, or 0.5 µm to about 1 µm for improved heat dissipation in the package 600. Although FIGS. 11A and 11B illustrates the metallic thermal vias 406 having a particular configuration, it should be understood that the metallic thermal vias 406 may have any shape and/or size (e.g., as discussed above with respect to FIGS. 8B, 8C, 9A, 9B, and 9C). The metallic thermal vias 406 may or may not have a uniform shape and/or size in the package 600. After the metallic thermal vias 406 are formed, an insulating material 408 may be formed around the semiconductor die 300, the metallic thermal base 404, and the metallic thermal vias 406 as described above with respect to FIGS. 8A through 8C.

In accordance with some embodiments, semiconductor devices may be bonded together to provide a 3D integrated chip (3DIC) package, such as a system on integrated chip (SoIC) package. The bottom semiconductor device may extend laterally past edges of the top semiconductor device. In some embodiments, heat may be dissipated away from the bottom semiconductor device by metal heat dissipation structures that on a surface of the bottom semiconductor device and adjacent to the top semiconductor device. The metal heat dissipation structures may be formed by a two separate lithography and electroplating processes which forms a thermal base and a plurality of metal pillars on the thermal base. The metal heat dissipation structures may be adapted to a particular configuration based on package device and/or thermal management requirements of a the device. Advantages may be achieved by providing a heat dissipation structure according to various embodiments. The advantages include high thermal dissipation efficiency, targeted hot spot management by overlapping heat dissipation features with device hot spots, ease of integration with SoIC processes, excellent hot spot area targeting with the two lithography processes, ease of manufacturing and adaptation to different package configurations (e.g., different package component shapes and/or dimensions).

In accordance with some embodiments, a device package includes a first die directly bonded to a second die at an interface, wherein the interface comprises a metal-to-metal bond and a heat dissipation feature over the first die, the heat dissipation feature comprising: a thermal base over the first die and surrounding the second die, wherein the thermal base is made of a metal; and a plurality of thermal vias on the thermal base. The device package further includes an encapsulant over first die and surrounding the second die, surrounding the thermal base, and surrounding the plurality of thermal vias. Optionally, in some embodiments, the plurality of thermal vias is made of a metal. Optionally, in some embodiments, the interface comprises an oxide-to-oxide bond formed by a first dielectric layer of the first die contacting a second dielectric layer of the second die, and the heat dissipation feature is disposed directly on the first dielectric layer of the first die. Optionally, in some embodiments, the first dielectric layer has a first thickness directly under the heat dissipation feature, wherein the first dielectric layer has a second thickness directly under the second die, and wherein the first thickness is less than the second thickness. Optionally, in some embodiments, the first thickness is in a range of 0.1 µm to 3 µm. Optionally, in some embodiments, a first thermal via of the plurality of thermal vias has a larger area in a top-down view than a second thermal via of the plurality of thermal vias. Optionally, in some embodiments, a first thermal via of the plurality of thermal vias has a different shape in a top-down view than a second thermal via of the plurality of thermal vias. Optionally, in some embodiments, each of the plurality of thermal vias has a uniform size. Optionally, in some embodiments, each of the plurality of thermal vias has a uniform shape. Optionally, in some embodiments, the heat dissipation feature overlaps a circuit of the first die, and wherein the circuit is a serializer/deserializer or an input/output circuit.

In accordance with some embodiments, a package includes a first die over and bonded to a second die, wherein a backside of the first die is bonded to a front side of the second die, and wherein a first dielectric layer of the first die is directly bonded to a second dielectric layer of the second die. The package further includes a seed layer on the second dielectric layer; a metallic thermal base on the seed layer; and a plurality of metallic thermal vias on the metallic thermal base; and an encapsulant encapsulating the first die, the seed layer, the metallic thermal base, and the plurality of metallic thermal vias. Optionally, in some embodiments, the metallic thermal base surrounds the second die. Optionally, in some embodiments, the metallic thermal base is electrically isolated from the first die and the second die. Optionally, in some embodiments, the metallic thermal base extends lower than the first die.

In accordance with some embodiments, a method includes bonding a first die to a second die, wherein bonding the first die to the second die comprises directly bonding a first dielectric layer of first die to a second dielectric layer of second die; depositing a seed layer over the first dielectric layer; plating a thermal base on the seed layer using a first lithography and plating process; plating a plurality of thermal vias on the thermal base using a second lithography and plating process; removing excess portions of the seed layer; and encapsulating the second die, the thermal base, and the plurality of thermal vias in an encapsulant. Optionally, in some embodiments, bonding the first die to the second die further comprises directly bonding a first bonding pad of the first die to a second bonding pad of the second die. Optionally, in some embodiments, the method further includes prior to depositing the seed layer and after bonding the first die to the second die, recessing an exposed surface of the first dielectric layer. Optionally, in some embodiments, after recessing the exposed surface of the first dielectric layer, the first dielectric layer has a thickness in a range of 0.1 µm to 3 µm. Optionally, in some embodiments, depositing the seed layer comprises depositing the seed layer over and along sidewalls of the second die. Optionally, in some embodiments, no seed layer is deposited between the thermal base and the plurality of thermal vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device package comprising:
   a first die directly bonded to a second die at an interface, wherein the interface comprises a metal-to-metal bond;
   a heat dissipation feature over the first die, the heat dissipation feature comprising:
      a thermal base over the first die, wherein the thermal base is made of a metal material, wherein a top surface of the metal material of the thermal base is disposed at a level above a bottom surface of the second die and below a top surface of the second die; and
      a plurality of thermal vias on the thermal base; and
   an encapsulant over the first die and surrounding the second die, surrounding the thermal base, and surrounding the plurality of thermal vias.

2. The device package of claim 1, wherein the plurality of thermal vias is made of a metal, and wherein the encapsulant contacts the top surface of the metal material of the thermal base.

3. The device package of claim 1, wherein the interface comprises an oxide-to-oxide bond formed by a first dielectric layer of the first die contacting a second dielectric layer of the second die, and wherein the heat dissipation feature is disposed directly on a same surface of the first dielectric layer of the first die as the second die.

4. The device package of claim 3, wherein the first dielectric layer has a first thickness directly under the heat dissipation feature, wherein the first dielectric layer has a second thickness directly under the second die, and wherein the first thickness is less than the second thickness.

5. The device package of claim 4, wherein the first thickness is in a range of 0.1 µm to 3 µm.

6. The device package of claim 1, wherein a first thermal via of the plurality of thermal vias has a larger area in the top-down view than a second thermal via of the plurality of thermal vias.

7. The device package of claim 1, wherein a first thermal via of the plurality of thermal vias has a different shape in the top-down view than a second thermal via of the plurality of thermal vias.

8. The device package of claim 1, wherein each of the plurality of thermal vias has a uniform size.

9. The device package of claim 1, wherein each of the plurality of thermal vias has a uniform shape.

10. The device package of claim 1, wherein the heat dissipation feature overlaps a circuit of the first die, and wherein the circuit is a serializer/deserializer or an input/output circuit.

11. A package comprising:
a first die over and bonded to a second die, wherein a backside of the first die is bonded to a front side of the second die, and wherein a first dielectric layer of the first die contacts a second dielectric layer of the second die at an interface;
a seed layer on the second dielectric layer;
a metallic thermal base on the seed layer;
a plurality of metallic thermal vias on the metallic thermal base; and
an encapsulant encapsulating the first die, a first metal material of the seed layer, a second metal material of the metallic thermal base, and a third metal material of the plurality of metallic thermal vias, wherein the first die, the seed layer, the metallic thermal base, and the plurality of metallic thermal vias are each disposed within the encapsulant.

12. The package of claim 11, wherein the metallic thermal base surrounds the second die, wherein a metal material of the metallic thermal base extends continuously between adjacent ones of the plurality of metallic thermal vias.

13. The package of claim 11, the metallic thermal base is electrically isolated from the first die and the second die.

14. The package of claim 11, wherein the metallic thermal base extends continuously from above the interface where the first dielectric layer contacts the second dielectric layer to lower than the interface where the first dielectric layer contacts the second dielectric layer.

15. A package comprising:
a first semiconductor die;
a second semiconductor die over and bonded to the first semiconductor die, wherein a first insulating bonding layer of the first semiconductor die is directly bonded to a second insulating bonding layer of the second semiconductor die;
a thermal dissipation feature contacting the first insulating bonding layer and extending along the second semiconductor die, wherein the thermal dissipation feature comprises:
a metallic base on a top surface of the first insulating bonding layer; and
a plurality of metallic vias extending upwards from the metallic base, wherein in a cross-sectional view, a metal material of the metallic base extends continuously from a first sidewall of a first metallic via of the plurality of metallic vias to a second sidewall of a second metallic via of the plurality of metallic vias.

16. The package of claim 15 further comprising a molding compound around the thermal dissipation feature and the second semiconductor die, wherein the molding compound contacts a top surface of the metal material of the metallic base in a region between the first metallic via and the second metallic via in the cross-sectional view.

17. The package of claim 16, wherein the molding compound extends continuously from above an interface between the first insulating bonding layer and the second insulating bonding layer to lower than the interface between the first insulating bonding layer and the second insulating bonding layer.

18. The package of claim 15, wherein the thermal dissipation feature further comprises a seed layer between the metallic base and the first insulating bonding layer.

19. The package of claim 18, wherein the seed layer is disposed at a lower level than an interface between the first insulating bonding layer and the second insulating bonding layer.

20. The package of claim 15, wherein the metallic base encircles the second semiconductor die in a top down view.

* * * * *